(12) United States Patent
Cakmak et al.

(10) Patent No.: US 11,203,675 B2
(45) Date of Patent: Dec. 21, 2021

(54) MACHINES AND PROCESSES FOR PRODUCING POLYMER FILMS AND FILMS PRODUCED THEREBY

(71) Applicant: Purdue Research Foundation, West Lafayette, IN (US)

(72) Inventors: Mukerrem Cakmak, Lafayette, IN (US); Armen Yildirim, Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 654 days.

(21) Appl. No.: 16/167,714

(22) Filed: Oct. 23, 2018

(65) Prior Publication Data
US 2019/0352475 A1 Nov. 21, 2019

Related U.S. Application Data

(60) Provisional application No. 62/576,601, filed on Oct. 24, 2017.

(51) Int. Cl.
*C08J 5/18* (2006.01)
*C08K 3/04* (2006.01)
(Continued)

(52) U.S. Cl.
CPC ............... *C08J 5/18* (2013.01); *C08K 3/041* (2017.05); *C08K 3/042* (2017.05); *C08K 3/11* (2018.01);
(Continued)

(58) Field of Classification Search
CPC . C08J 5/18; C08K 3/041; C08K 3/042; C08K 3/11; H01L 41/0805
See application file for complete search history.

(56) References Cited

U.S. PATENT DOCUMENTS

2014/0230577 A1 8/2014 Cakmak et al.
2016/0181506 A1* 6/2016 Sirbuly ............... H01L 41/183
                                                  252/62.9 PZ

FOREIGN PATENT DOCUMENTS

WO    2018081357    5/2018

OTHER PUBLICATIONS

Ingrid Graz, Martin Kaltenbrunner, Christoph Keplingr, Reinhard Schwodiauer, and Siegfried Bauer; "Flexible ferroelectret field-effect transistor for large-area sensor skins and microphones", Applied Physics Letters 89, 073501 (2006).
(Continued)

*Primary Examiner* — Matthew E. Hoban
(74) *Attorney, Agent, or Firm* — Hartman Global IP Law; Gary M. Hartman; Domenica N. S. Hartman

(57) ABSTRACT

Processes and machines suitable for producing polymer films, and films produced thereby. Lead zirconate titanate (PZT) particles and electrically conductive nanoparticles are combined in a liquid polymer precursor matrix and aligned along nanocolumns in a thickness direction of the polymer precursor matrix by subjecting the PZT and nanoparticles to a uniform electric field, after which the polymer precursor matrix is solidified to form a piezoelectric polymer composite film. The PZT and nanoparticles are subjected to the uniform electric field for a duration sufficient to promote sensitivity and/or energy harvesting properties of the piezoelectric polymer composite film.

20 Claims, 23 Drawing Sheets
(21 of 23 Drawing Sheet(s) Filed in Color)

(51) Int. Cl.
    *C08K 3/11*       (2018.01)
    *H01L 41/08*      (2006.01)
    *C08L 83/04*      (2006.01)
    *H01L 41/193*     (2006.01)
    *C08K 3/22*       (2006.01)

(52) U.S. Cl.
    CPC .......... *C08L 83/04* (2013.01); *H01L 41/0805* (2013.01); *H01L 41/193* (2013.01); *C08K 2003/2237* (2013.01); *C08K 2201/001* (2013.01); *C08K 2201/011* (2013.01)

(56) References Cited

OTHER PUBLICATIONS

E. Unsal, J. Drum, O. Yucel, I.I. Nugay, B. Yalcin, and M. Cakmak, "Real-time measurement system for tracking birefringence, weight, thickness, and surface temperature during drying of solution cast coatings and films", Review of Scientific Instruments 83, 025114 (2012).

Youfan Hu, Zhong Lin Wang, "Recent progress in piezoelectric nanogenerators as a sustainable power source in self-powered systems and active sensors", Nano Energy (2015) 14, 3-14.

Michael A. Fonseca, Mark G. Allen, Jason Krob, and Jason White, "Flexible wireless passive pressure sensors for biomedical applications", Solid State Sensors, Actuators, and Microsystems Workshop, South Carolina, Jun. 2006.

Zhong Lin Wang and Jinhui Song, "Piezoelectric Nanogenerators Based on Zinc Oxide Nanowire Arrays", Apr. 14, 2006, vol. 312 Science.

Canan Dagdeviren, Byung Duk Yang, Yewang Su, Phat . Tran, Pauline Joe, Eric Anderson, Jing Xia, Vijay Doraiswamy, Behrooz Dehdashti, Xue Feng, Bingwei Lu, Robert Poston, Zain Khalpey, Roozbeh Ghaffari, Yonggang Huang, Marvin J. Slepian, and John A Rogers, "Conformal piezoelectric energy harvesting and storage from motions of the heart, lung, and diaphragm", PNAS, Feb. 4, 2014, vol. 111, No. 5, 1927-1932.

Hanna Yousef, Mehdi Boukallel, Kaspar Althoefer, "Tactile sensing for dexterous in-hand manipulation in robotics—A review", Sensors and Actuators A 167 (2011) 171-187.

Nanshu Lu and Dae-Hyeong Kim, Flexible and Stretchable Electronics Paving the Way for Soft Robotics, Soft Robotics, vol. 1, No. 1, 2013.

Jing Yan and Young Gyu Jeong, "High performance flexible piezoelectric nanogenerators based on BaTiO3 Nanofibers in different alignment modes", Applied Materials & Interfaces, 2016 American Chemical Society, 15700-15709.

Yuanhao Guo, Yuwei Chen, Enmin Wang, and Miko Cakmak, Roll-to-Roll continuous manufacturing multifunctional nanocomposites by electric-field-assisted "Z" direction alignment of graphite flakes in poly (dimethylsiloxane), Applied Materials & Interfaces, 204 American Chemical Society; 919-929.

Saurabh Batra, Emre Unsal, and Miko Cakmak, "Directed electric field Z-alignment kinetics of anisotropic nanoparticles for enhanced ionic conductivity", Adv. Funct. Matter, 2014, 24, 7698-7708.

Siegfried Bauer, Simona Bauer-Gogonea, Ingrid Graz, Martin Kaltenbrunner, Christoph Keplinger, and Reinhard Schwodiauer, "25th anniversary article: A soft future: from robots and sensor skin to energy harvesters", Advanced Materials; 2014, 26, 149-162.

Yuwei Chen, Yuanhao Guo, Saurabh Batra, Emre Unsal, Enmin Wang, Yanping Wang, Xueqing Liu, Yimin Wang, and Miko Cakmak, "Large-scale R2R fabrication of piezoresistive films (Ni/PDMS) with enhanced through thickness electrical and thermal properties by applying a magnetic field", RSC Advances, 2015, 5, 92071-92079.

Mallory L. Hammock, Alex Chortos, Benjamin C.-K. Tee, Jeffrey B.-H. Tok and Zhenan Bao, "25th Anniversary Article: The evolution of electronic skin (E-Skin): A brief history, design considerations, and recent progress", Advanced Materials, 2013, 25, 5997-6038.

Caixia Hu, Li Cheng, Zhe Wang, Youbin Zheng, Suo Bai, and Yong Qin, "A transparent antipeep piezoelectric nanogenerator to harvest tapping energy on screen", Small Journal, 2016, 12, No. 10, 1315-1321.

D. Johnston, D.K. McCluskey, C.K.L. Tan and M.C. Tracey, "Mechanical characterization of bulk Sylgard 184 for microfluidics and microengineering", Journal of Micromechanics and Microengineering, 24, (2014), 035017 (7pp).

Zong-Hong Lin, Ya Yang, JYH Ming Wu, Ying Liu, Fang Zhang, and Zhong Lin Wang, "BaTiO3 Nanotubes-Based Flexible and Transparent Nanogenerators", The Journal of Physical Chemistry Letters, 2012 American Chemical Society, 3599-3604.

Kawai, "The Piezoelectricity of Poly (vinylidene Fluoride)", Japan J. Appl. Phys. 8 (1969) 975-976).

Kenry, Joo Chuan Yeo and Chwee Teck Lim, "Emerging flexible and wearable physical sensing platforms for healthcare and biomedical applications", Microsystems & Nanoengineering (2016) 2, 16043.

Rusen Yang, Yong Qin, Cheng Li, Guang Zhu, and Zhong Lin Wang, "Converting biomechanical energy into electricity by a muscle-movement-driven nanogenerator", NANO Letters, American Chemical Society, 2009, 9 (3), 1201-1205.

Luana Persano, Canan Dagdeviren, Yewang Su, Yihui Zhang, Salvatore Girardo, Dario Pisignano, Yonggang Huang and John A. Rogers, "High performance piezoelectric devices based on aligned arrays of nanofibers of poly(vinylidenefluoride-co-trifuloroethylene)", Nature Communications, Published Mar. 27, 2013 (4:1633).

Xi Chen, Shiyou Xu, Nan Yao, and Yong Shi, "1.6 V Nanogenerator for mechanical energy harvesting using PZT nanofibers", American Chemical Society, 2010, 10, 2133-2137.

Long Gu, Nuanyang Cui, Li Cheng, Qi Xu, Suo Bai, Miaomiao Yuan, Weiwei Wu, Kinmei Liu, Yong Zhao, Fei Ma, Yong Qin, and Zhong Lin Wang, "Flexible fiber nanogenerator with 209 V output voltage directly powers a light-emitting diode", American Chemical Society, 2013, 13, 91-94.

Stefan C.B. Mannsfeld, Benjamin C-K. Tee, Randall M. Stoltenberg, Chrisotpher V.H-H. Chen, Soumendra Barman, Beinn V.O. Muir, Anatolly N. Sokolov, Colin Reese, and Zhenan Bao, "Highly sensitive flexible pressure sensors with microstructured rubber dielectric layers", Nature Materials, vol. 9, Oct. 2010, 859-864.

Ilias Katsouras, Kamal Asadi, Mengyuan Li, Tim. B. Van Driel, Kasper S. Kjaer, Dong Zhao, Thomas Lenz, Yun Gu, Paul. W. M. Blom, Dragan Damjanovic, Martin M. Nielsen and Dago M. Deleeuw, The negative piezoelectric effect of the ferroelectric polymer poly(vinylidene fluoride), Nature Materials, vol. 15, Jan. 2016, 78-85.

Mehmet Kanik, Ozan Aktas, Huseyin Sener Sen, Engin Durgun, and Mehmet Bayindir; "Spontaneous high piezoelectricity in poly (vinylidene fluoride) nanoribons produced y iterative thermal size reduction technique", vol. 8, No. 9, 9311-9323, 2014, ACS Nano.

Weiwei Wu, Suo Bai, Miaomiao Yuan, Yong Qin, Zhong Lin Wang, and Tao Jing, "Lead zirconate titanate nanowire textile nanogenerator for wearable energy-harvesting and self-powered devices", vol. 6, No. 7, 6231-6235, 2012, ACS Nano.

Kwi-LL Park, Minbaek Lee, Ying Liu, San Moon, Geon-Tae Hwang, Guang Zhu, Ji Eun Kim, Sang Ouk Kim, Do Kyung Kim, Zhong Lin Wang, and Keon Jae Lee, "Flexible nanocomposite generator made of BaTiO3 nanoparticles and graphitic carbons", Adv. Mater. 2012, 24, 2999-3004.

Kwi-LL Park, Chang Kyu Jeong, Jungho Ryu, Geon-Tae Hwang, and Keon Jae Lee, "Flexible and large-area nanocomposite generators based on lead zirconate titanate particles and carbon nanotubes". Adv. Energy Mater., 2013, 3, 1539-1544.

Kwi-LL Park, Jung Hwan Son, Geon-Tae Hwang, Chang Kyu Jeong, Jungho Ryu, Min Koo, Insung Choi, Seung Hyun Lee, Myunghwan Byun, Zhong Lin Wang, and Keon Jae Lee, "Highly-efficient, flexible piezoelectric PZT thin film nanogenerator on plastic substrates", Adv. Mater. 2014, 26, 2514-2520.

Dae Yong Park, Daniel J. Joe, Dong Hyun Kim, Hyweon Park, Jae Hyun Han, Chang Kyu Jeong, Hyelim Park, Jung Gyu Park,

(56) References Cited

OTHER PUBLICATIONS

Boyoung Joung, and Keon Jae Lee, "Self-powered real-time arterial pulse monitoring using ultrathin epidermal piezoelectric sensors", Adv. Mater. 2017, 29, 1702308.

Kwi-IL Park, Chang Kyu Jeong, Na Kyung Kim, and Keon Jae Lee, "Stretchable piezoelectric nanocomposite generator", Nano Covergence, 2016.

Aminy E. Ostfeld, Abhinav M. Gaikwad, Yasser Khan and Ana C. Arias, "High-performance flexible energy storage and harvesting system for wearable electronics", Scientific Reports 6-26122, Published May 17, 2016.

Dae-Hyeong Kim, Nanshu Lu, Roozbeh Ghaffari, Yun-Soung Kim, Stephein P. Lee, Lizhi Xu, Jian Wu, Rak-Hwan Kim, Jizhou Song, Zhuangjian Liu, Jonathan Viventi, Bassel De Graff, Briane Elolampi, Moussa Mansour, Marvin J. Slepian, Sukwon Hwang, Joshua D. Moss, Sang-Min WN, Younggang Huang, Brian Litt and John A. Rogers, Materials for multifunctional balloon catheters with capabilities in cardiac electrophysiological mapping and ablation therapy, Nature Materials, Vo. 10, Apr. 2011.

Gregor Schwartz, Benjamin C.-K. Tee, Jianguo Mei, Anthony L. Appleton, Do Hwan Kim, Huiliang Wang and Zhenan Bao, "Flexible polymer transistors with high pressure sensitivity for application in electronic skin and health monitoring", Nature Communications, 41859, Published May 14, 2013.

Canan Dagdeviren, Yewang Su, Pauline Joe, Raissa Yona, Yuhao Liu, Yun-Soung Kim, Yongan Huang, Anoop R. Damadoran, Jing Xia, Lane W. Martin, Yonggang Huang, and John A. Rogers, "Conformable amplified lead zirconate titanate sensors with enhanced piezoelectric response for cutaneous pressure monitoring", Nature Communications, Published Aug. 5, 2014.

Tran Quang Trung and Nae-Eung Lee, "Flexible and stretchable physical sensor integrated platforms for wearable human-activity monitoring and personal healthcare", Advanced Materials, 2016, 28, 4338-4372.

* cited by examiner

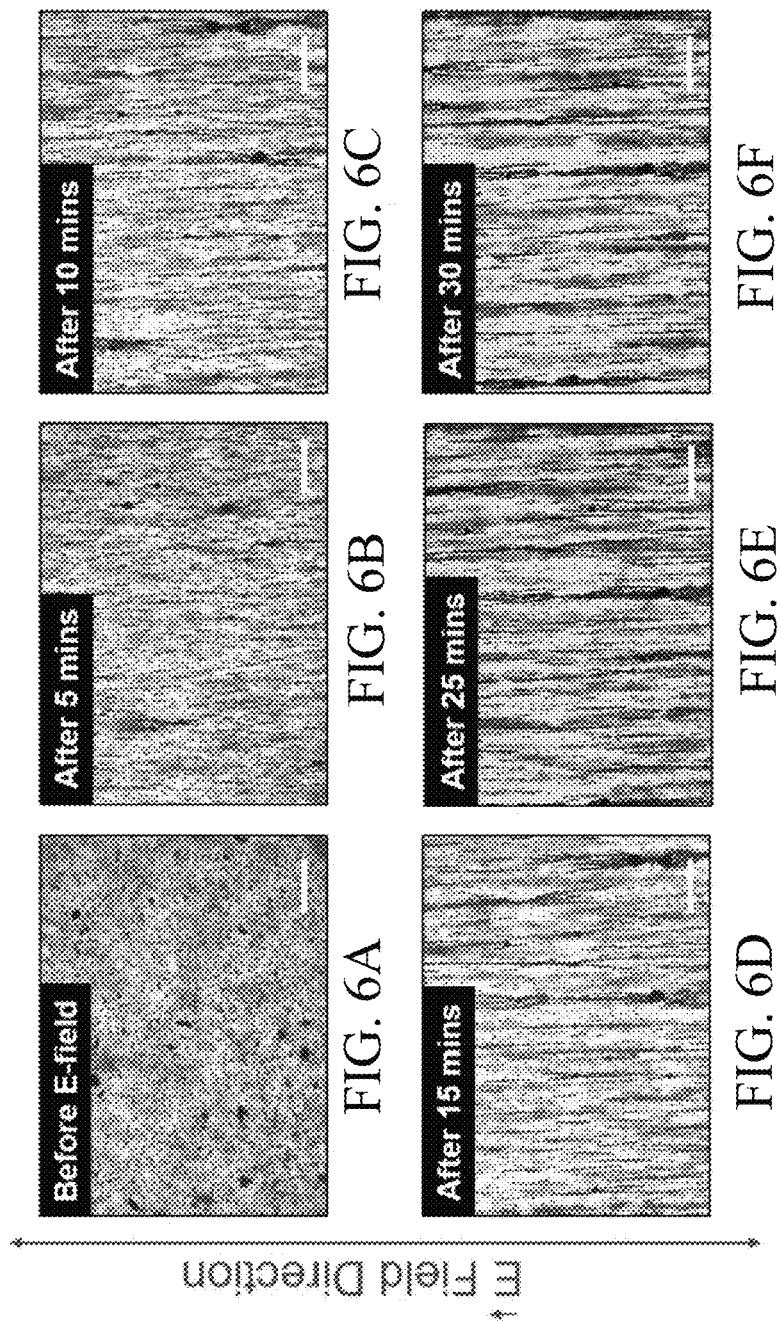

E-Field Direction

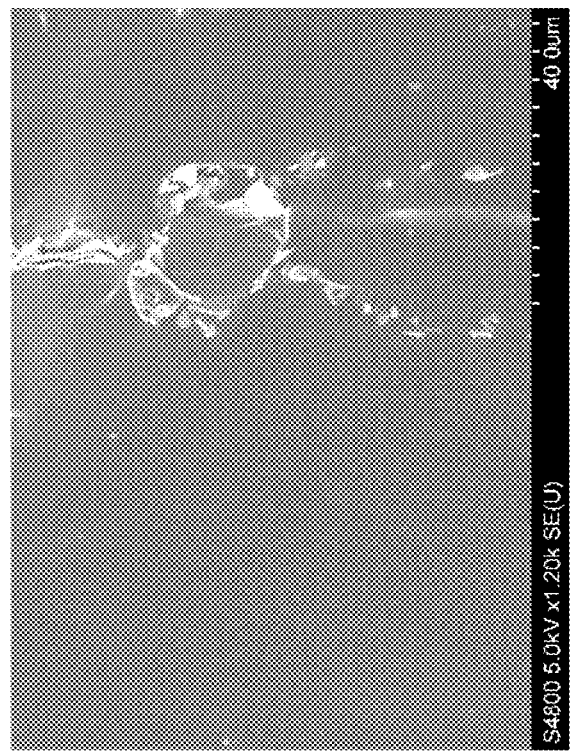
FIG. 16

MACHINES AND PROCESSES FOR PRODUCING POLYMER FILMS AND FILMS PRODUCED THEREBY

CROSS REFERENCE TO RELATED APPLICATIONS

This application claims the benefit of U.S. Provisional Application No. 62/576,601, filed Oct. 24, 2017, the contents of which are incorporated herein by reference.

BACKGROUND OF THE INVENTION

The present invention generally relates to machines and processes for producing polymer films. The invention particularly relates to machines and processes capable of producing piezoelectric polymer composite films suitable for the fabrication of flexible multifunctional devices, as nonlimiting examples, highly sensitive sensors and nanogenerators.

The potential impacts of wearable technologies have become more evident with the introduction of the "Internet of Things" (IoT), which can basically be described as a smart network where every electronic device is connected to each other through embedded sensors and the Internet. As a result, there is an increasing demand for the use of flexible, ultra-lightweight and transparent sensors and nanogenerators for self-powered electronics adapted for use in a wide range of applications, as a nonlimiting example, personal health monitoring, soft robotics, human-inspired electronic skin (e-skin), energy harvesting, and biomedical applications. Among various types of available systems, piezoelectric materials and their polymer counterparts are attracting a great deal of attention due to their high levels of sensitivity and fast response times even at small deformations.

Among polymers, poly(vinylidene fluoride) (PVDF) and its copolymers, such as poly(vinylidene fluoride-co-trifluoroethylene) (PVDF-TrFE), are believed to exhibit the highest piezoelectric coefficient values. Ultra-high sensitive piezoelectric devices have been reported based on aligned nanofibers of PVDF-TrFE that can sense pressures as low as 0.1 Pa. Likewise, conformal piezoelectric devices have been reported based on lead zirconate titanate (PZT) that are capable of monitoring cutaneous pressure changes at very low pressure sensitivity levels (for example, about 0.005 Pa with 0.1 ms precision).

In addition to pressure sensors and other mechanical sensing devices, other notable applications for piezoelectric materials include kinetic energy harvesting for self-powered macroscale and nanoscale electronic devices. As an example, nanoscale mechanical energy has been converted into electrical energy by utilizing aligned zinc oxide (ZnO) nanowires as piezoelectric nanogenerators with an estimated power efficiency of 17 to 30%. Fully rollable nanogenerator systems have been introduced based on ZnO nanowires between chemical vapor deposition (CVD)-grown large scale graphene electrodes. Self-powered thin patch loudspeakers have been reported that are based on ferroelectret nanogenerators (FENGs). Such devices can be used in various areas ranging from sound recording thin films to microphones for privacy security applications. PZT and barium titanate ($BaTiO_3$) have also been utilized extensively for the development of nanogenerators and various other energy harvesting applications. Advanced piezoelectric devices have been reported based on PZT ribbons that harvest energy directly from the natural contraction and relaxation motions of the heart, lungs, and diaphragm. PZT nanotubes have been fabricated and utilized for power generation with diameter and length values of 200 nm and 58 µm, respectively. The PZT nanotube-based system was reportedly able to generate up to 469 mV when a steel nugget was dropped from different heights. PZT nanotube-based energy harvesters have been reported in which nanotubes were embedded into a polydimethylsiloxane (PDMS) matrix. The observed current and voltage outputs were reported to be around 54.5 nA and 1.52 V, respectively. The production of large area PZT and carbon nanotube-based nanocomposite generators have been demonstrated wherein 100 V voltage output and 10 µA current generation were reported during the application of irregular biomechanical deformations onto a 30 cm×30 cm sample. Chemical epitaxial growth of PZT nanowires and their application as a power source for wireless microelectronics have been reported as achieving an output voltage of 0.7 V with a power density of 2.8 mW $cm^{-3}$.

Besides the aforementioned studies and innovations, the alignment of piezoelectric materials in a specific direction is capable of further improving the energy harvesting features of nanogenerators devices. A flexible nanogenerator with 209 V output voltage and a current density of 23.5 µA/$cm^2$ has been reported, wherein PZT fibers were aligned in a thickness (z) direction of a film. Furthermore, the dielectrophoretic properties of piezo compounds can also be utilized to achieve preferential alignment. As an example, the electric field induced alignment of PZT nanowires has been demonstrated wherein PZT nanowires were synthesized by an electrospinning technique and aligned in the z-direction under a uniform external electric field. It was observed that the alignment of the PZT particles drastically changed the piezoelectric properties of the composite material in terms of voltage and current output. The effect of the alignment of $BaTiO_3$ nanofibers in vertical and horizontal modes has also been reported. In one case, a maximum voltage of 2.67 V and a current of 261.40 nA was reported for BaTiO3 nanofibers vertically aligned in a PDMS matrix.

Notwithstanding the above achievements, further improvements are desired for nanogenerators, pressure sensors, and their production, for example, in terms of their flexibility, power efficiency, transparency (in applications such as touchscreen interfaces, display panels, and electronic skin for soft robotics), and compatibility with continuous large-scale production processes that are more cost effective than batch processing methods.

BRIEF DESCRIPTION OF THE INVENTION

The present invention provides processes and machines suitable for producing polymer films, as a nonlimiting example, a piezoelectric polymer composite film, and the films produced thereby.

According to one aspect of the invention, a process for producing a piezoelectric polymer composite film includes combining lead zirconate titanate (PZT) particles and electrically conductive nanoparticles in a liquid polymer precursor matrix, aligning the PZT and nanoparticles along nanocolumns in a thickness direction of the liquid polymer precursor matrix by subjecting the PZT and nanoparticles to a uniform electric field, and solidifying the liquid polymer precursor matrix to form a piezoelectric polymer composite film comprising the PZT and nanoparticles in a polymer matrix formed by solidifying the liquid polymer precursor matrix. The PZT and nanoparticles are subjected to the uniform electric field for a duration sufficient to promote sensitivity and/or energy harvesting properties of the piezoelectric polymer composite film.

According to another aspect of the invention, a piezoelectric polymer composite film is provided that includes a polymer matrix with lead zirconate titanate (PZT) particles and electrically conductive nanoparticles aligned along nanocolumns in a thickness direction of the polymer matrix.

Other aspects of the invention include roll-to-roll machines configured to perform the process comprising the steps described above.

Technical aspects of the process described above preferably include the ability to produce high performance, flexible piezoelectric polymer composite films, including PZT/GNP-based devices, for example, for use as piezoelectric nanogenerators (piezonanogenerators, PENGs) and highly sensitive pressure sensors, in which PZT particles and GNPs (or other electrically conductive nanoparticles) are aligned within a polymer film under an electric field in the thickness (z) direction of the film. By appropriately aligning the PZT particles and GNPs, the amount of particles required to develop a piezoelectric polymer composite can be greatly reduced. As a result, if the film is formed of a transparent or translucent material, a high level of transparency can be maintained, as is desired for certain applications, as a nonlimiting example, touchscreen interfaces. Moreover, the electric field-induced alignment of the conductive nanoparticles (i.e., graphene nanoplatelets) along with the PZT nanoparticles facilitates the charge transport in the system. Preferential alignment in the thickness direction is also capable of giving rise to a unique structure where the pattern of PZT chains around the GNPs is similar to electric field lines around an electrically conducting particle when placed in a uniform external electric field. Because the nanoparticles align along nanocolumns in the thickness direction of the film, the transparency of the film becomes direction dependent, with normal direction viewing being the most transmissive and transmissivity decreasing in off-normal directions, leading to the ability to form films that may be useful for privacy screen applications, providing multifunctionality in a single contiguous product.

Furthermore, preferred embodiments of the process can be compatible with continuous large-scale roll-to-roll (R2R) production lines that are capable of increasing the size and number of devices that can be produced in a given time period while reducing material costs in comparison to traditional methods for producing piezoelectric polymer composites.

Other aspects and advantages of this invention will be further appreciated from the following detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 6A, 6B, 6C, 6D, 6E, and 6F contain optical microscope images of a PZT/GNPs/PDMS film and show the progressive formation of PZT/GNPs columns in the thickness (z) direction of the film during electric field alignment.

FIG. 16 contain SEM images obtained from a large-area electric field aligned sample (R2R).

DETAILED DESCRIPTION OF THE INVENTION

The following describes machines and processes for producing polymer films, including piezoelectric polymer composite films (or simply, piezoelectric films) suitable for the fabrication of flexible multifunctional devices, as nonlimiting examples, nanogenerators and highly sensitive force and pressure sensors. The machines and processes are capable of providing for roll-to-roll (R2R) production of flexible transparent multifunctional devices in which lead zirconate titanate (PZT) particles and graphene nanoplatelets (GNPs) are aligned in a transparent polymer film, for example, polydimethylsiloxane (PDMS) or similar soft polymer matrix such as a polyurethane, silicone rubber, etc., to yield flexible and transparent PZT/GNP-based piezonanogenerators (PENGs) for self-powered electronics and sensor applications. The machines and processes are preferably implemented on continuous large-scale roll-to-roll production lines.

In investigations leading to the present invention, piezoelectric polymer composite films were produced by combining lead zirconate titanate (PZT) particles as piezoelectric fillers (0.50 vol %) and a small volume fraction (0.02 vol. %) of graphene nanoplatelets (GNPs) in a liquid polymer precursor matrix of polydimethylsiloxane (PDMS) commercially available from Dow Corning under the name Sylgard® 184. To promote the sensitivity and the energy harvesting properties of the piezoelectric composites, the PZT particles and GNPs were then aligned in the thickness (z) direction of the matrix by being subjected to a uniform electric field. Though graphene was used, other electrically conductive nanoparticles, including but not limited to other electrically conductive graphitic nanoparticles (e.g., single and multiwall carbon nanotubes, graphite etc.) could be used to increase the charge transport rate, and hence the sensitivity and the response time. Thermocurable PDMS was chosen for the matrix film material in view of its well-known properties in flexible electronics, such as high elasticity, optical transparency, and low cost. However, various other polymeric resins (e.g., thermo- and photocurable thermosets or thermoplastics) could be used, as nonlimiting examples, similar soft polymer materials such as a polyurethane or a silicone rubber. Though 0.50 vol % PZT concentration was selected for the investigation, it is believed herein that based on this and other investigations reported herein that suitable PZT concentrations in a given system may range from about 0.05 vol % to about 15 vol %, depending on the particular application. As examples, lower concentrations may be suitable for applications in which ultra-high sensitivity is not necessarily required, whereas higher concentrations may be suitable for high voltage output applications at the expense of transparency.

Figure 1:
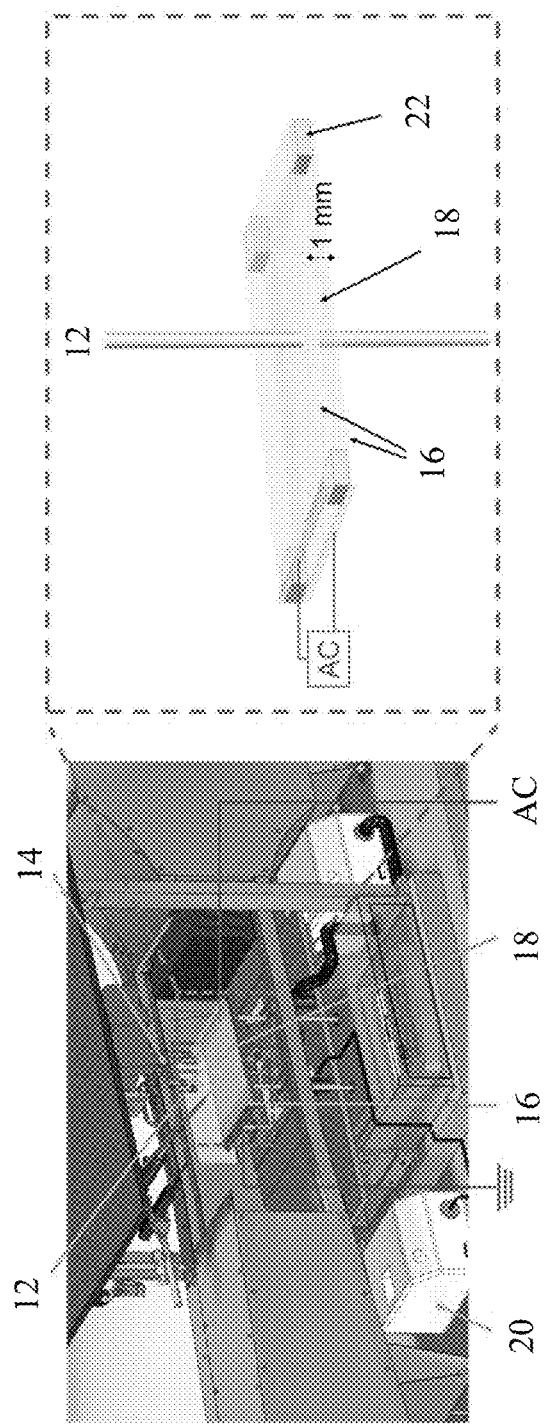
FIG. 1 schematically represents a real-time measurement system configured to track light transmission during electric field induced alignment. The inset represents the electric field alignment setup.

The PZT particles and GNPs were uniformly dispersed in the thermocurable PDMS resin using a planetary centrifugal mixer and then a curing agent for the PDMS was introduced into the mixture at a 1:10 ratio to the PDMS. A doctor-blade casting method was used to cast 150 μm-thick piezoelectric films between two indium tin oxide (ITO)-coated glass panels that served as bottom and top electrodes. The gap between the electrodes was kept constant at 1 mm by using glass spacers. The PZT particles within different films were then aligned at four different AC electric field strengths at a constant frequency (100 Hz): 250 V/mm, 500 V/mm, 750 V/mm, and 1000 V/mm. A real-time measurement system was developed and used to track the real-time light transmission during electric field alignment. The system, depicted in FIG. 1, included a zero-degree light transmission 12, light detector 14, transparent ITO coated glass 16, sample 18, light source 20, and glass spacers 22.

Figure 2:
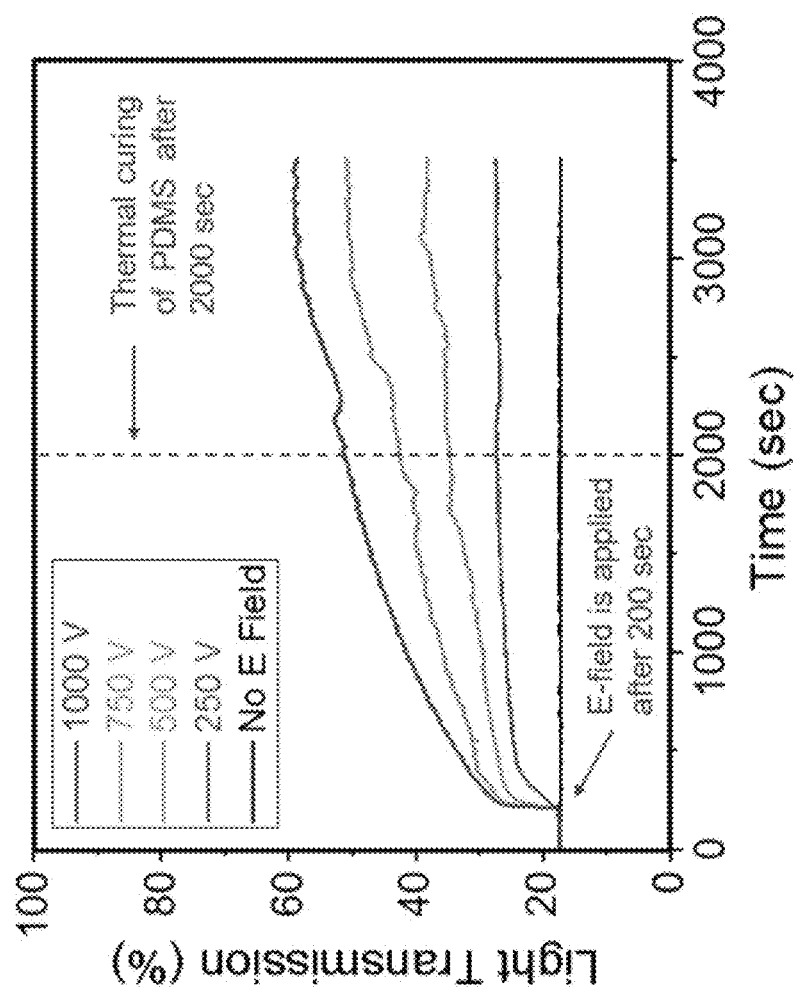
FIG. 2 is a graph that reveals the effect of applied field strength on light transmission through piezoelectric films produced to contain PZT particles in accordance with a nonlimiting embodiment of the invention.
Figure 3:
FIG. 3 contains an image showing an electric field aligned 150 µm-thick PZT/PDMS piezoelectric film.
Figure 4F:
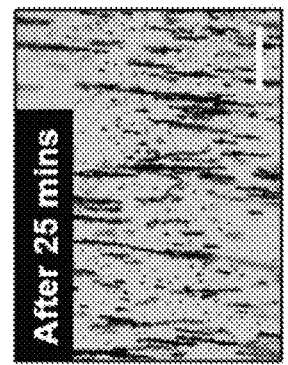
FIGS. 4A, 4B, 4C, 4D, 4E, and 4F evidence that within, the piezoelectric films, the PZT particles are progressively arranged in nano- and micro-columnar structures along the applied electric field direction.
Figure 4E:
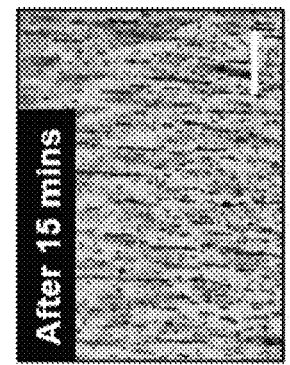
Figure 4A:
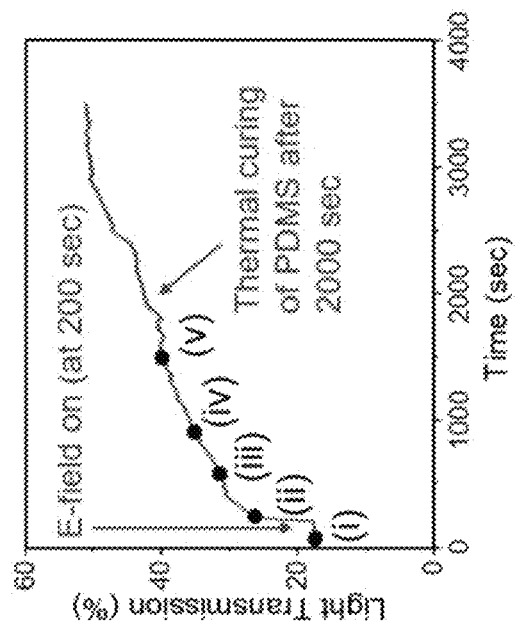
Figure 4D:
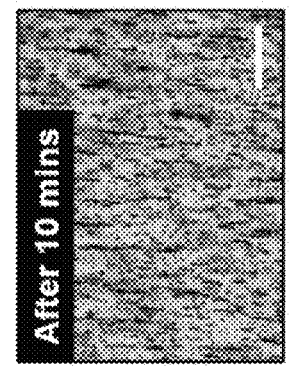
Figure 4B:
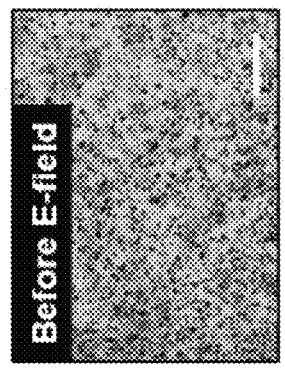
Figure 4C:
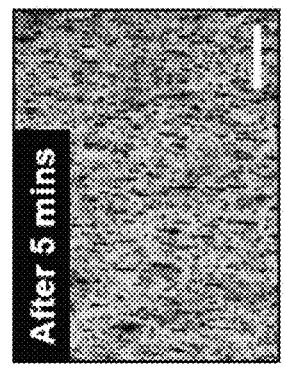

FIG. 2 is a graph that reveals the effect of applied field strength on the light transmission through the piezoelectric films. When the electric field was applied after 200 seconds, a sharp increase in light transmission was observed due to the alignment of PZT particles in columns along the applied electric field. As shown in optical microscope images of FIGS. 4B through 4F, at this stage the PZT particles had assembled themselves into nano- and micro-columnar structures along the applied electric field direction, forming depletion zones in between which allowed light to travel through the films with less scattering and absorption losses. FIG. 3 shows the transparency level of a 150 μm thick PZT/PDMS sample aligned at 1000 V/mm (scale bar=1 cm). The graph of FIG. 4A and the images of FIGS. 4B through 4F evidence the progressive alignment of PZT particles into nano- and micro-columnar structures resulting from an electric field ("E Field") strength of 750V/mm (scale bar=50 μm), in which FIG. 4B was before application of the electric field and FIGS. 4C through 4F were 5, 10, 15, and 25 minutes, respectively, after the application of the electric field. Light transmission sharply increased with increasing field strength and tended to saturate and level off over time. For a film subjected to a field strength of 1000 V/mm (FIG. 2), the light transmission started at about 18% and rose to about 60%, indicating the alignment of PZT particles in the direction of the applied electric field.

Figure 5B:
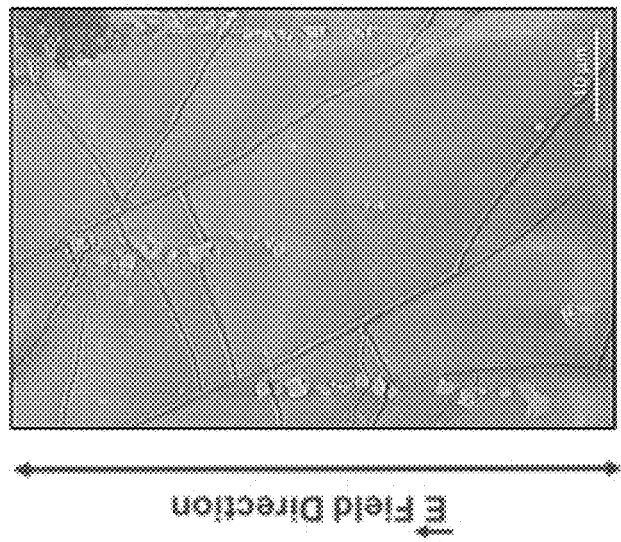
FIGS. 5A and 5B contain scanning electron microscopy (SEM) images showing the effect of the applied electric field on the alignment of PZT particles.
Figure 5A:
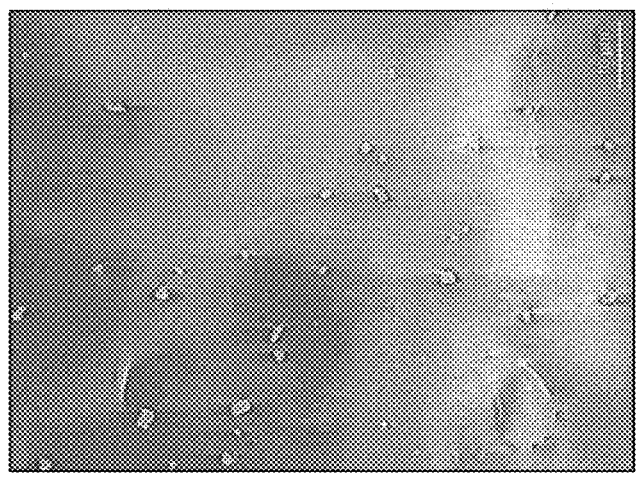

At 2000 seconds (i.e., after the application of the electric field for thirty minutes), the PDMS-based piezoelectric films were cured at a temperature of 85° C. for one hour to freeze the aligned PZT columns. The orientation of the PZT particles was observed under scanning electron microscopy (SEM), as shown in FIGS. 5A and 5B. FIG. 5A shows randomly distributed PZT particles prior to electric field alignment, and FIG. 5B shows aligned PZT particles following electric field alignment (scale bar=10 μm). The PZT particles are artificially colored to increase the contrast.

Figure 9:
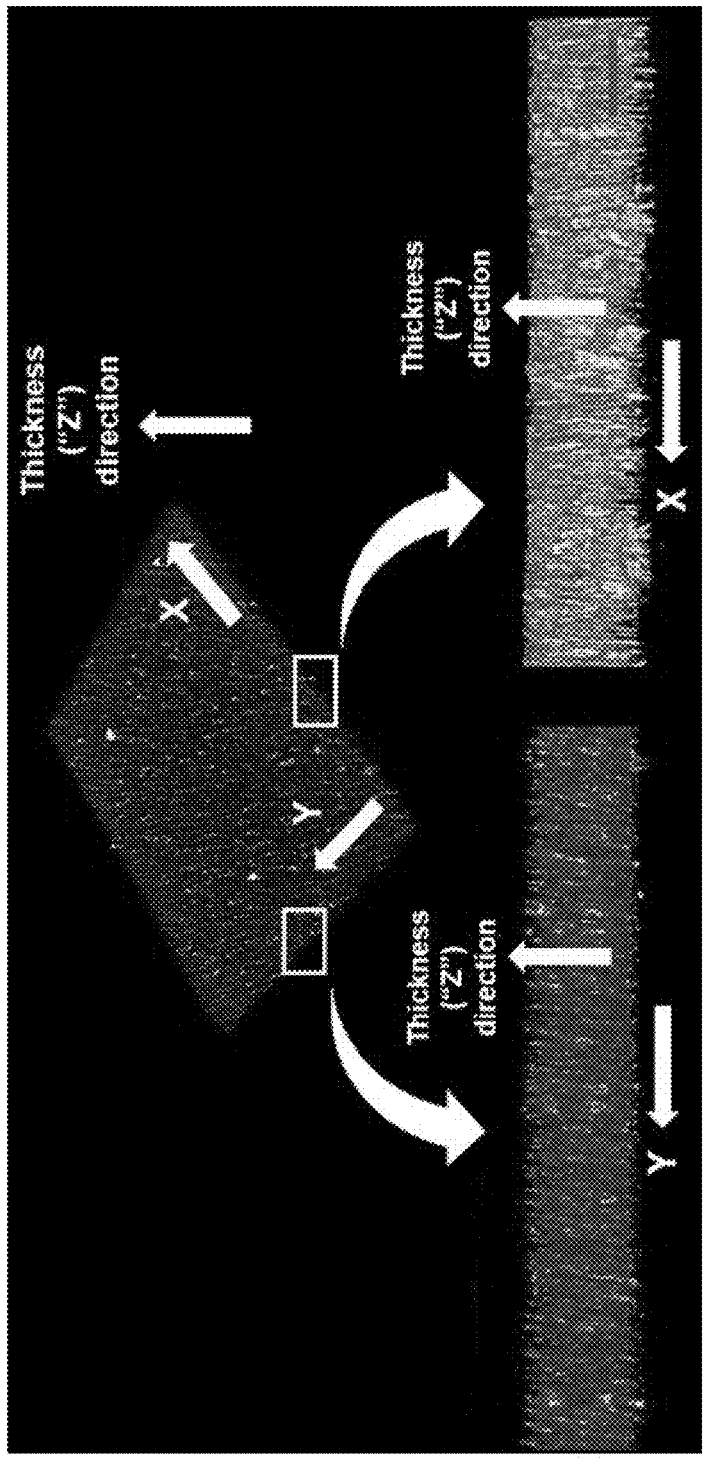
FIG. 9 contains micro-computed tomography (Micro CT) images of aligned PZT particles (scale bar: 100 µm).

To further demonstrate the degree of alignment, micro-computed tomography (Micro CT) images of aligned PZT particles are shown in FIG. 9. The micro-computed tomography images show the preferential alignment of the PZT particles along nanocolumns in the thickness direction of a piezoelectric film.

Figure 7:
FIG. 7 contains an image showing an electric field aligned 150 µm-thick PZT/GNPs/PDMS piezoelectric film.
Figure 10:
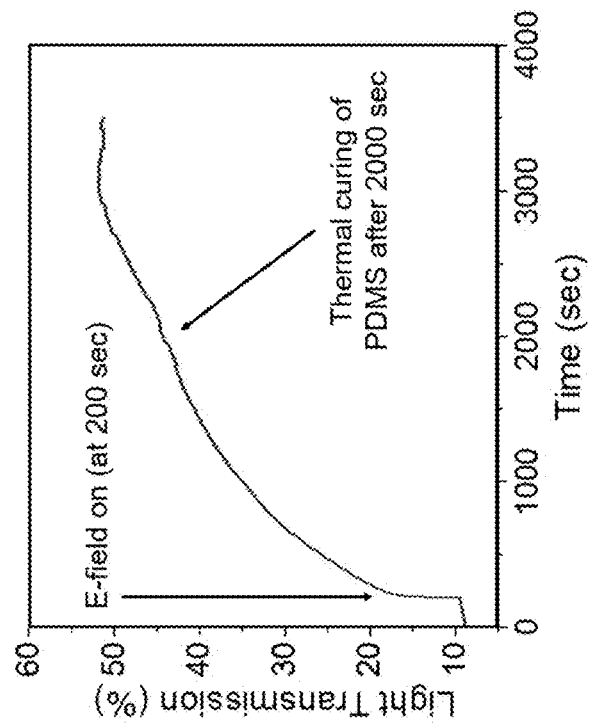
FIGS. 10 and 11 contain real-time light transmission data for two 150 µm-thick piezoelectric films, one a GNPs/PDMS system (0.02 vol. % GNPs) and the other a PZT/GNPs/PDMS system (0.5 vol. % PZT, 0.02 vol. % GNPs).
Figure 11:
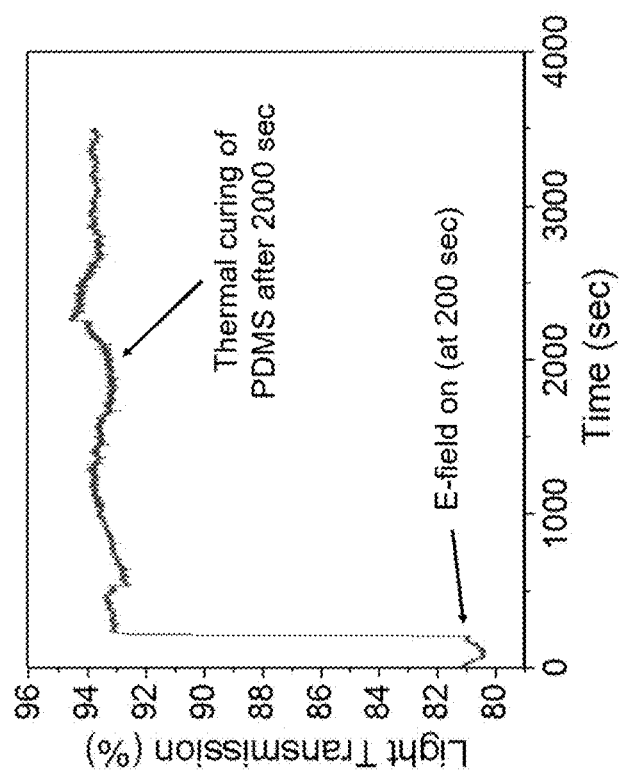

Real-time light transmission data for two 150 μm-thick piezoelectric films, one a GNPs/PDMS system (0.02 vol. % GNPs) and the other a PZT/GNPs/PDMS system (0.5 vol. % PZT, 0.02 vol. % GNPs), are provided in FIGS. 10 and 11, respectively. A uniform electric field was applied for 200 seconds and the samples were thermally cured after 2000 seconds. The light transmission for the GNPs/PDMS sample increased from about 81% to about 94% when subjected to the application of the electric field for 200 seconds, whereas light transmission for the PZT/GNPs/PDMS sample increased from about 8% and saturated around 52% when subjected to the application of the electric field for 200 seconds. FIG. 7 is an image showing the electric field-aligned 150 μm-thick PZT/GNPs/PDMS piezoelectric film (scale bar=1 cm).

Figure 8:
FIG. 8 contains an image showing an electric field-aligned 5 µm-thick PZT/GNPs/PDMS piezoelectric film cast on an ITO coated PET substrate.

FIG. 8 shows an electric field-aligned 5 μm-thick PZT/GNPs/PDMS piezoelectric film that had been cast on an ITO-coated polyethylene terephthalate (PET) substrate (scale bar=2 cm). The piezoelectric film exhibited around 90% optical transparency after electric field alignment.

Figure 12C:
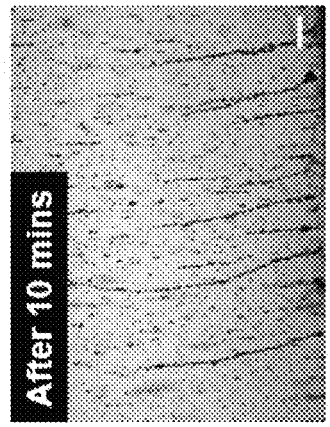
FIGS. 12A, 12B, 12C, 12D, 12E, and 12F contain optical microscope images of a GNPs/PDMS film and show the progressive formation of GNPs columns in the thickness (z) direction of the film during electric field alignment.
Figure 12B:
Figure 12A:
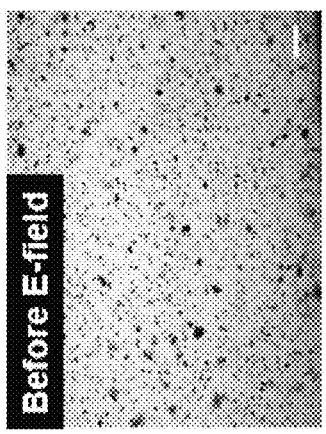
Figure 12F:
Figure 12E:
Figure 12D:
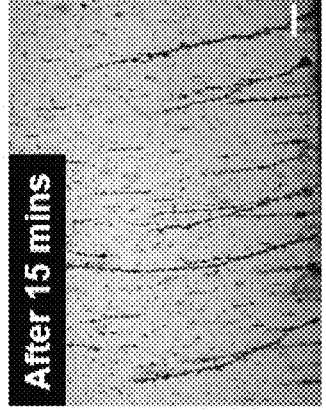

FIGS. 6A through 6F and FIGS. 12A through 12F contain optical microscope images that show the real-time alignment of particles in PZT/GNPs/PDMS and GNPs/PDMS films during the application of a uniform electric field, respectively. FIGS. 12A through 12F show the formation of GNPs columns in the thickness direction during electric field alignment using an electric field strength of 1000 V/mm (scale bar: 100 μm). FIG. 12A was taken before the application of the electric field, and FIGS. 12B, 12C, 12D, 12E, and 12F show alignment progression after 5, 10, 15, 25, and 35 minutes of electric field application. FIGS. 6A, 6B, 6C, 6D, 6E, and 6F show alignment progression in the PZT/GNPs/PDMS film for the same points in time when subjected to the same electric field strength. As clearly seen, the degree of alignment of particles in both systems increased over time.

Figure 13:
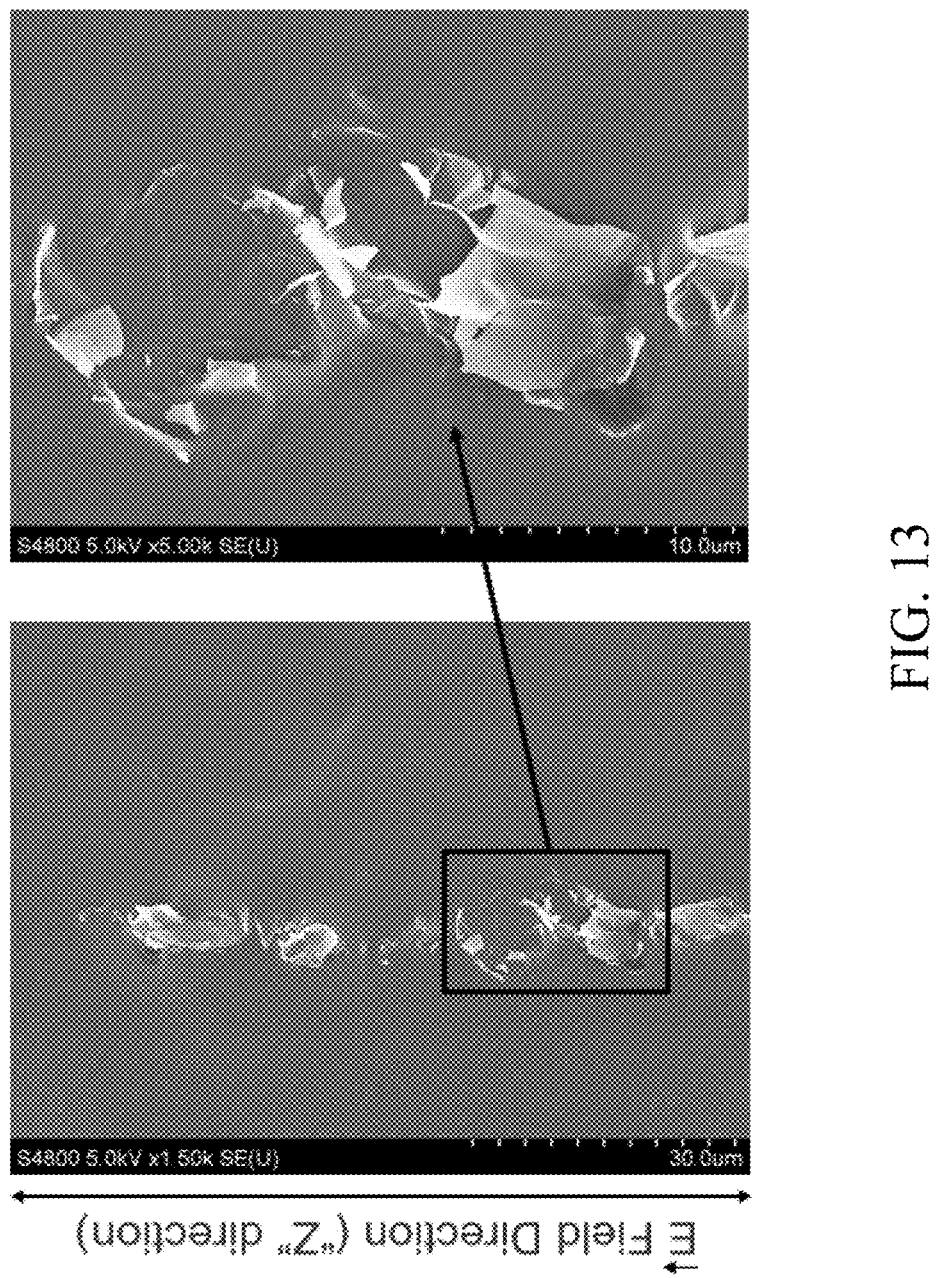
FIGS. 13 and 14 contain cross-sectional SEM images of, respectively, GNPs/PDMS and PZT/GNPs/PDMS films and reveal how the PZT particles and GNPs interacted with each other during electric field-induced alignment.
Figure 14:
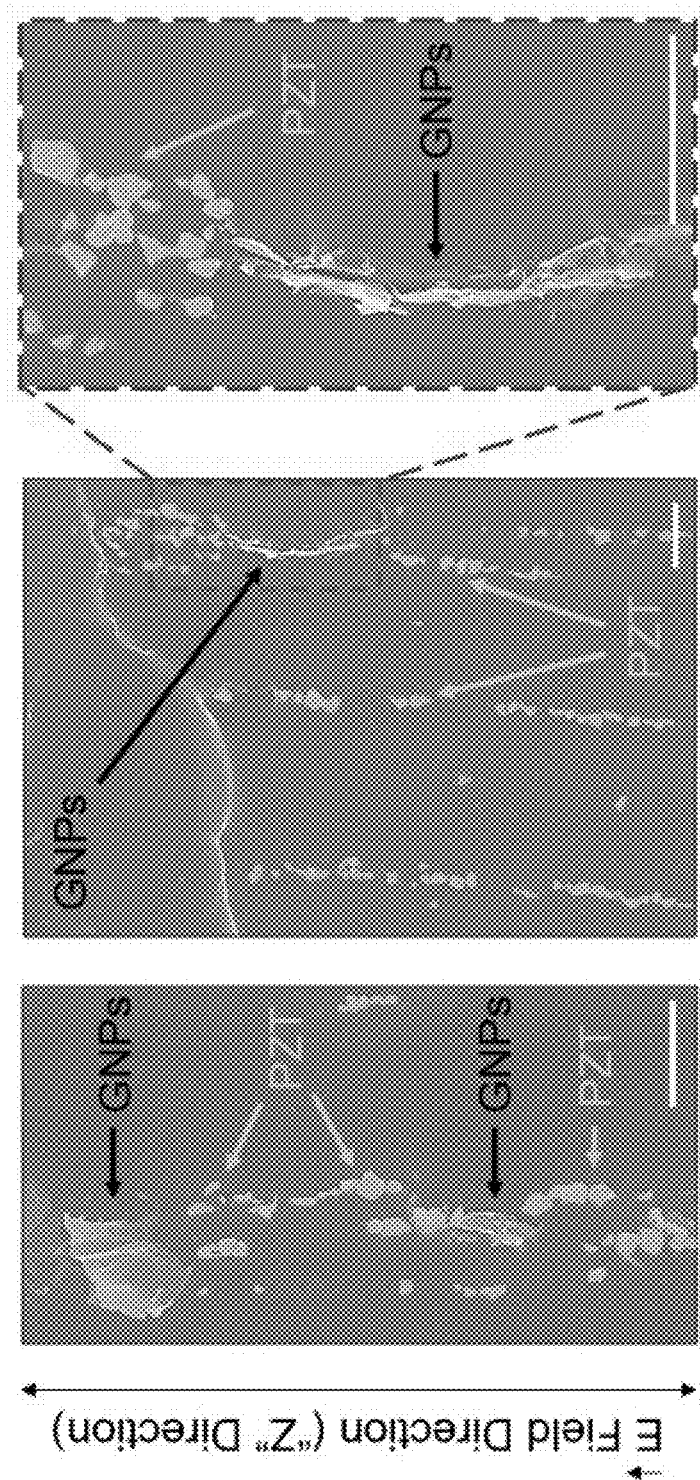
Figure 15:
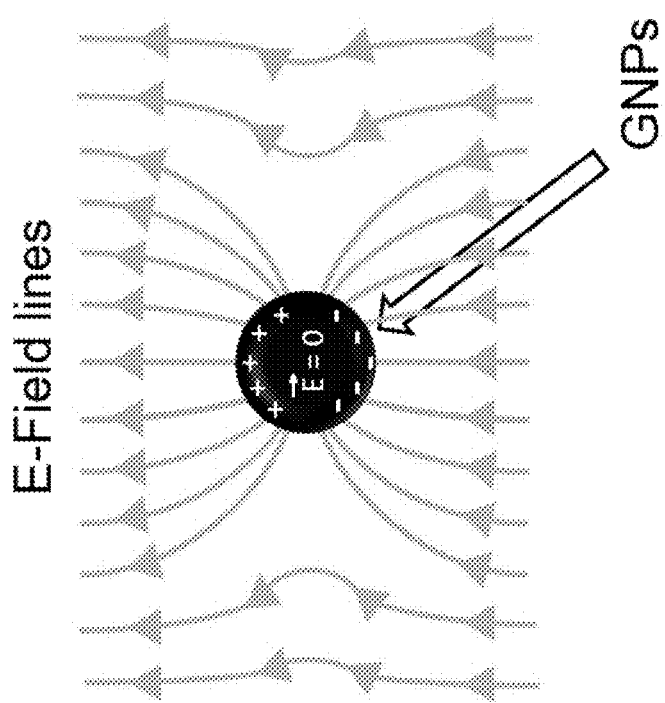
FIG. 15 schematically represents electric field lines around an electrically conducting particle when placed in a uniform external electric field.

FIGS. 13 and 14 contain cross-sectional SEM images of GNPs/PDMS and PZT/GNPs/PDMS films, respectively, and reveal how the PZT particles and GNPs interacted with each other during the electric field-induced alignment. The scale bars in FIG. 14 are 10 μm. As shown in FIG. 14, during alignment the PZT columns formed around the GNPs similar to electric field lines around an electrically conducting particle when placed in a uniform external electric field, schematically represented in FIG. 15. The GNPs are conducting and facilitate the charge transport in the film, hence increasing the sensitivity and nanogenerator capabilities of the piezoelectric films.

Figure 17:
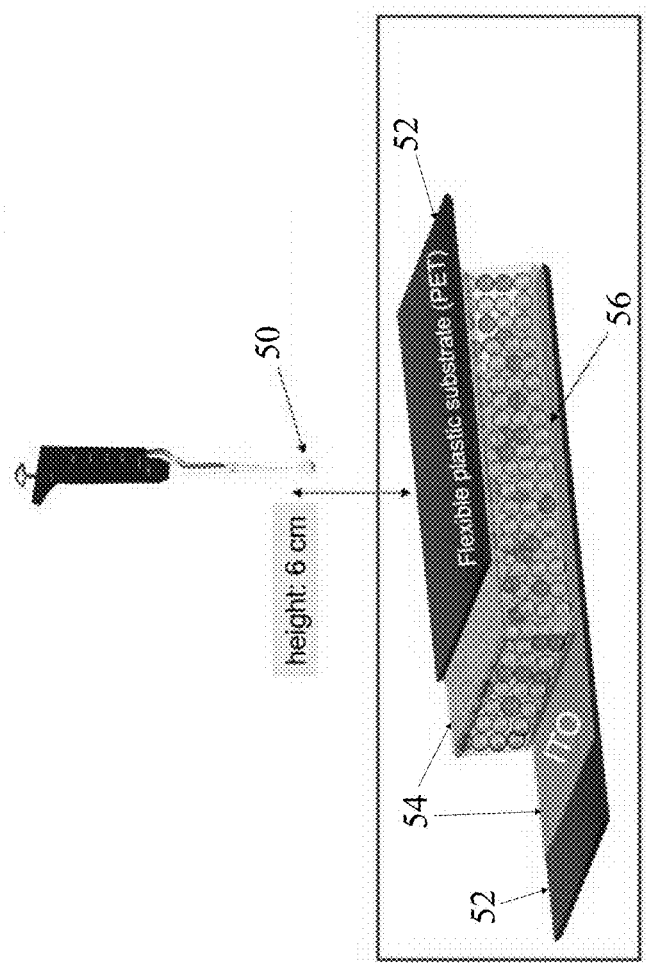
FIG. 17 contains a schematic representation of an experimental set-up of a water drop test.

Further investigations were then conducted to evaluate the piezoelectric responses of PZT/PDMS-based and PZT/GNP/PDMS-based piezoelectric films that had undergone electric field alignment for different periods of time. Devices were produced by laminating cured piezoelectric films between two ITO-coated PET electrodes. For comparison, devices were also fabricated from films that lacked PZT particles and GNPs ("Neat PDMS") but were otherwise identical to the PZT/PDMS-based and PZT/GNP/PDMS-based piezoelectric films. The length, width and thickness dimensions of the devices were 2.5 cm, 1.5 cm, and 150 μm, respectively. Electrical contacts are established with copper tapes and silver paste. The piezoelectric responses of the sample devices were evaluated by measuring the voltage output when different sizes of water droplets (5 μL, 10 μL, 20 μL, 30 μL) were dropped onto the devices from a constant height of 6 cm. The experimental setup is represented in FIG. 17. The schematic includes a water droplet 50, flexible and transparent plastic substrate (PET) 52, transparent ITO coating 54, and aligned PZT particles and GNPs 56.

Figure 19:
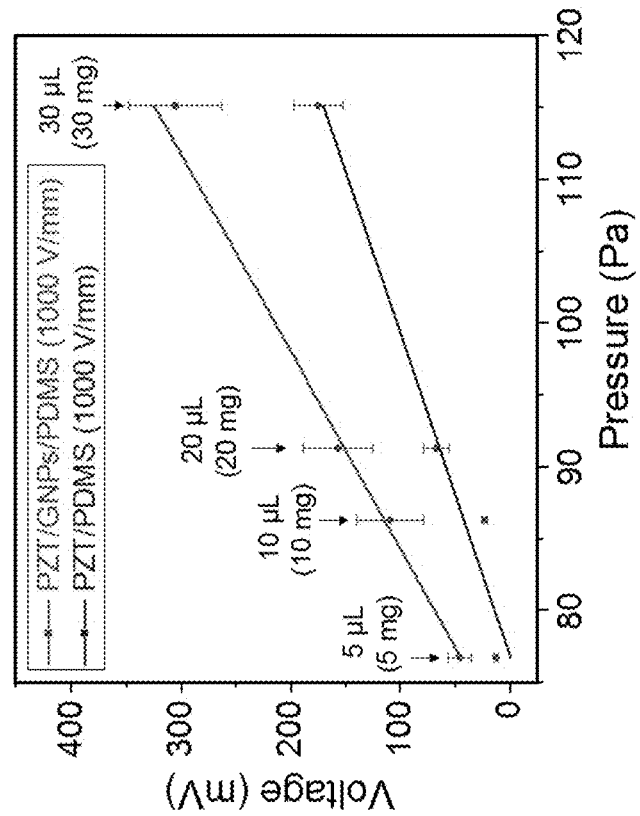
FIG. 19 is a graph evidencing the effect of graphene nanoparticles on voltage generation in a PZT/GNP/PDMS-based device.
Figure 18:
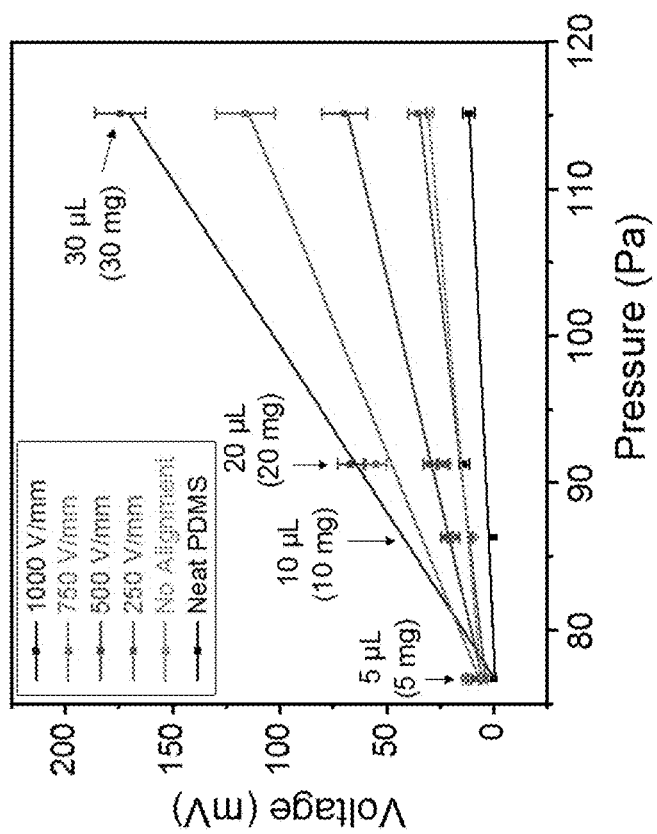
FIG. 18 plots the voltage level generated by PZT/PDMS-based devices relative to the size of droplets impacting the devices.

FIGS. 18 and 19 plot levels of voltage generated for the PZT/PDMS and PZT/GNPs/PDMS-based devices relative to droplet size, respectively. FIGS. 18 and 19 also indicate the calculated impact pressure values of the water droplets on the devices. An oscilloscope was used during the measurements with an input resistance of 10 MΩ. The highest voltage generations were obtained from the device that had been aligned under the highest field strength (1000 V/mm). This result indicated the importance of field strength on the alignment of PZT particles, and hence the piezoelectric response. It can clearly be seen from FIG. 18 that the voltage generation increased with increasing droplet size and approached 175 mV when the 30 μL droplet was delivered.

The voltage outputs that were obtained under the same conditions with the PZT/GNP/PDMS-based devices were dramatically higher. FIG. 19 clearly shows the effect of the graphene nanoparticles on voltage generation. For the 30 μL droplet size, the voltage generation approached 300 mV, compared to 175 mV for the PZT/PDMS-based devices. These results evidenced the outstanding capability of PZT/GNPs/PDMS systems in terms of converting mechanical energy into electrical energy. In comparison, prior investigations reported similar voltage levels as requiring finger pressure of about 2 kPa, much higher than the approximately 115 Pa impact of a water droplet, using piezoelectric nanogenerators based on PZT nanofibers.

Figure 21:
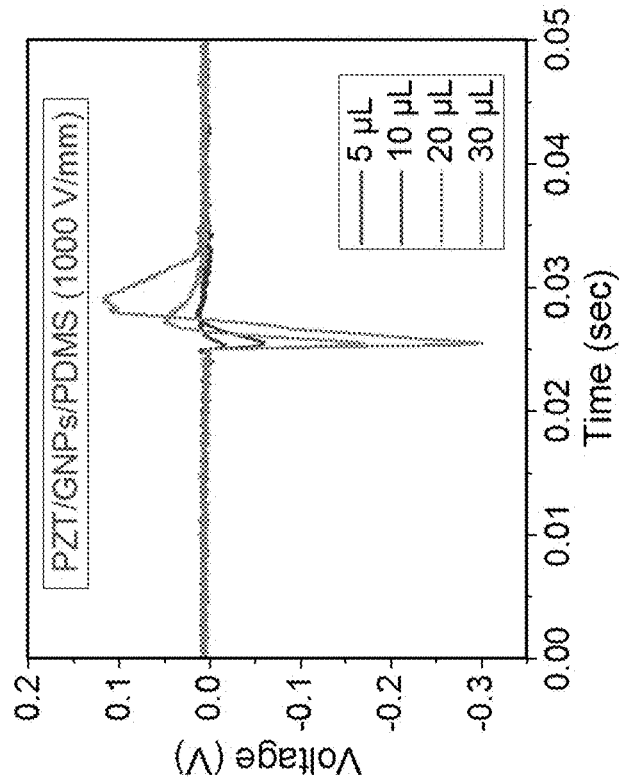
FIGS. 20 and 21 show oscilloscope outputs for different water droplet sizes when delivered onto PZT/PDMS and PZT/GNPs/PDMS-based devices, respectively.
Figure 20:
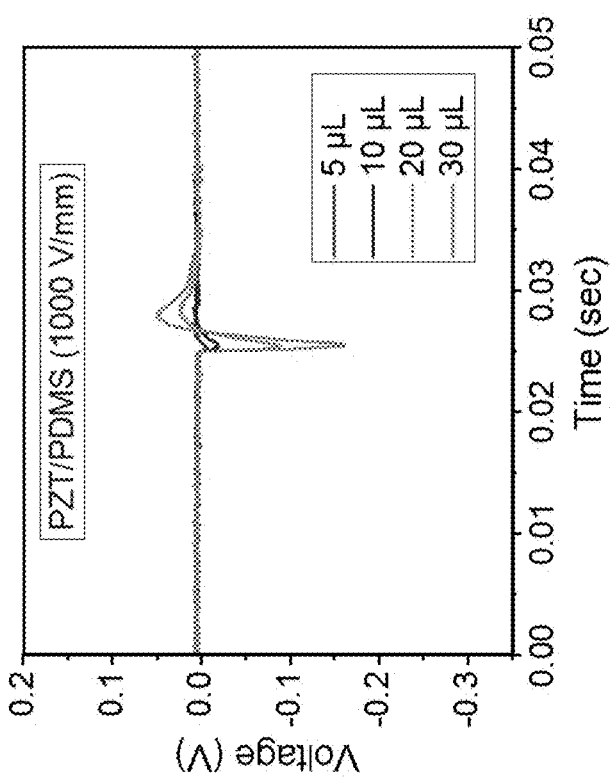
Figure 22:
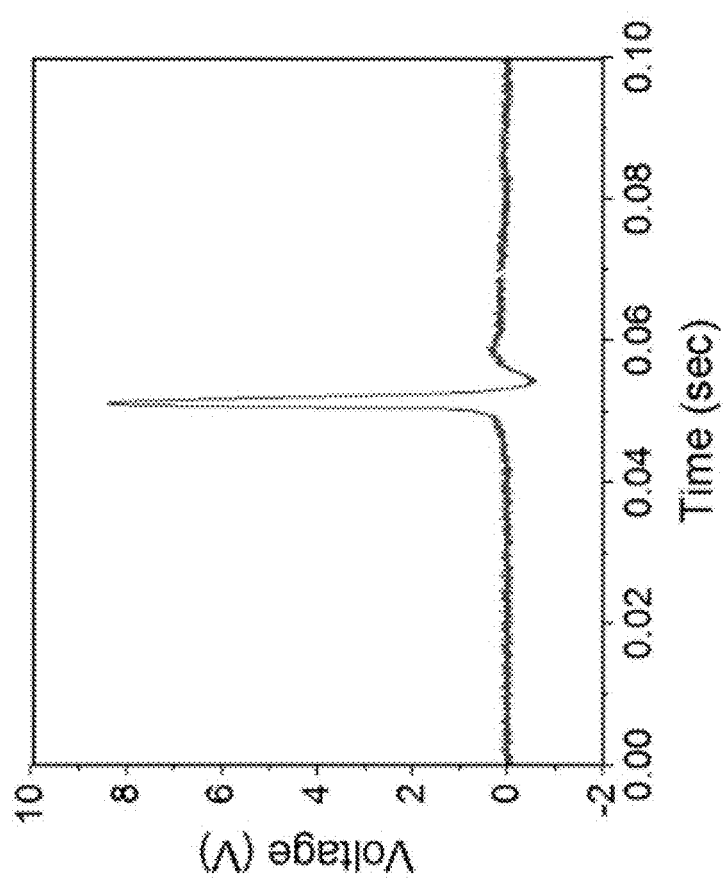
FIG. 22 shows oscilloscope outputs of a PZT/GNPs/PDMS-based device when subjected to the touch of a finger.

To further demonstrate the effect of GNPs, FIGS. 20 and 21 show oscilloscope outputs for different water droplet sizes when delivered onto the PZT/PDMS and PZT/GNPs/PDMS-based devices, respectively, whose data were plotted in FIG. 19. For comparison, FIG. 22 plots the oscilloscope output of the PZT/GNPs/PDMS-based device when subjected to the touch of a finger. The highest voltage output observed for PZT/GNPs/PDMS film was about 8.2 V. In the case of a similar device produced from 5 μm-thick films of FIG. 8, a 5.24 V voltage output was observed during a comparable finger touch experiment.

Besides their energy harvesting capabilities in response to mechanical deformations, the electric field-aligned PZT/GNPs/PDMS samples were also capable of sensing very small pressures. To demonstrate the outstanding pressure sensing features of the PZT/GNPs/PDMS devices, a bird feather (6.8 mg) was used as a load on a sample of a PZT/GNPs/PDMS-based device. When the bird feather was dropped onto the surface, an approximately 20 mV peak-to-peak voltage output was observed over a 20-millisecond range. The PZT/GNPs/PDMS-based devices were demonstrated as capable of sensing much smaller loads (a piece of a bird feather with a weight of 1.4 mg) at very fast response times.

Figure 23:
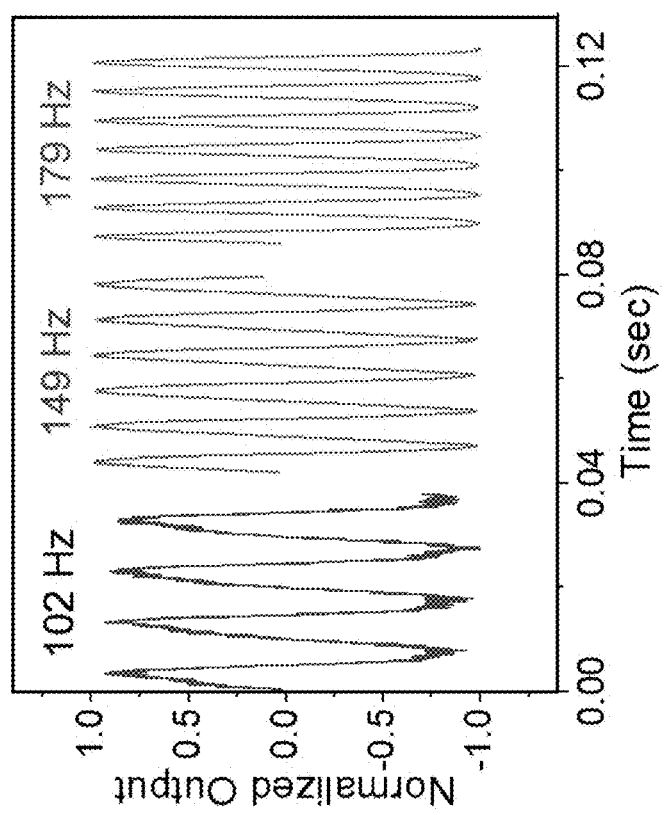
FIG. 23 contains a graph showing normalized outputs at different mechanical vibration frequencies (film dimension: 2.5 cm×1.5 cm×150 µm).

To demonstrate that the PZT/GNPs/PDMS samples were capable of detecting vibrations, a small vibration motor was attached on a plastic cantilever and connected to a power supply to deliver loads to the samples at different frequencies. The normalized output is shown in FIG. 23. The voltage output was normalized to remove amplitude variations caused by the frequency dependence of both the mechanical impedance of the cantilever and vibratory motor output (normal for all mechanical transducers and couplers). This experiment showed that the films were able to reproduce vibratory inputs at different frequencies as low as 102 Hz.

Figure 24:
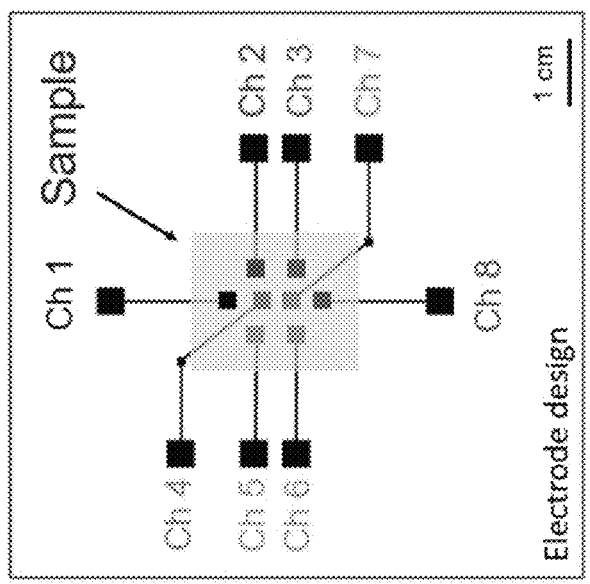
FIG. 24 contains a schematic representation of inkjet-printed silver electrodes located on the film.
Figure 25:
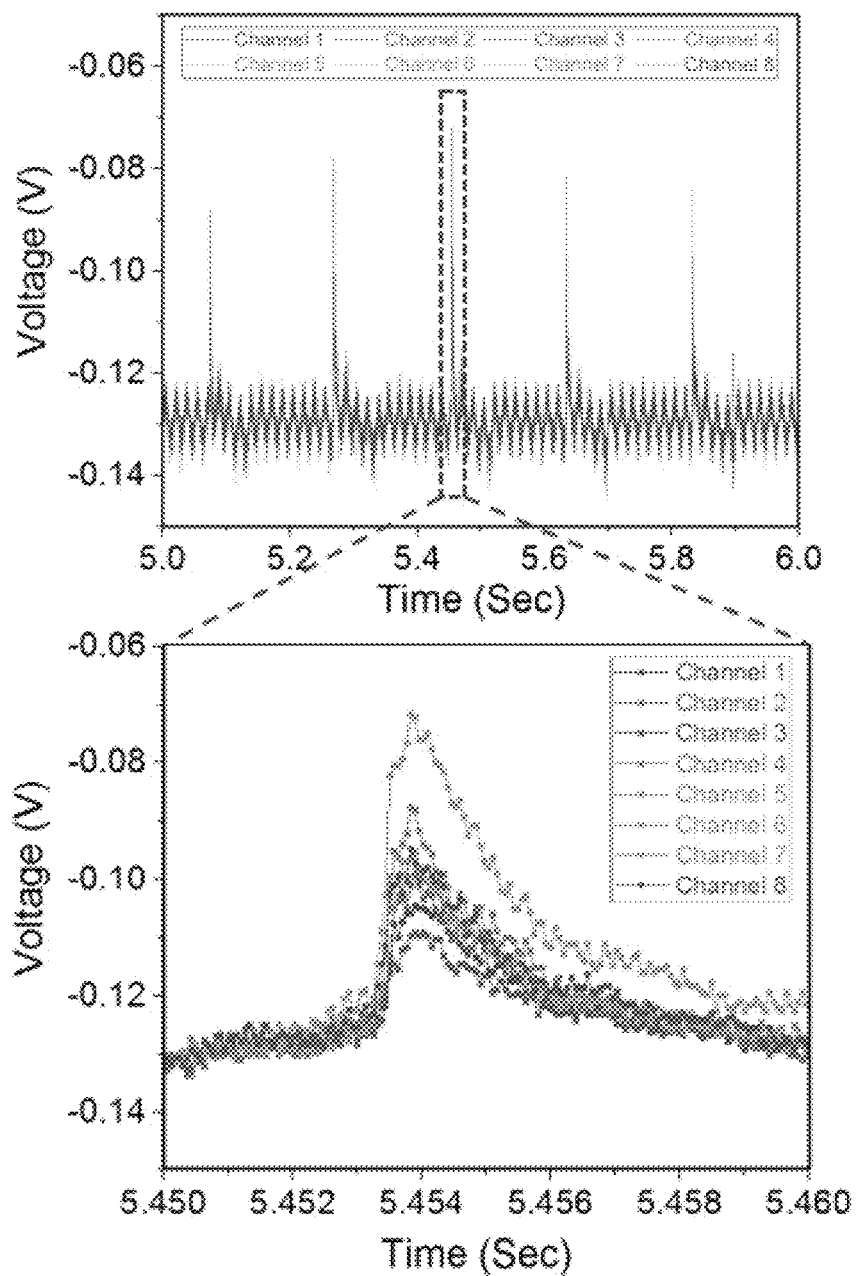
FIG. 25 contains graphs representing an output voltage versus time plot. The magnified view shows the variations in voltage generation (due to non-uniform pressure distribution) obtained from each individual electrode.
Figure 26:
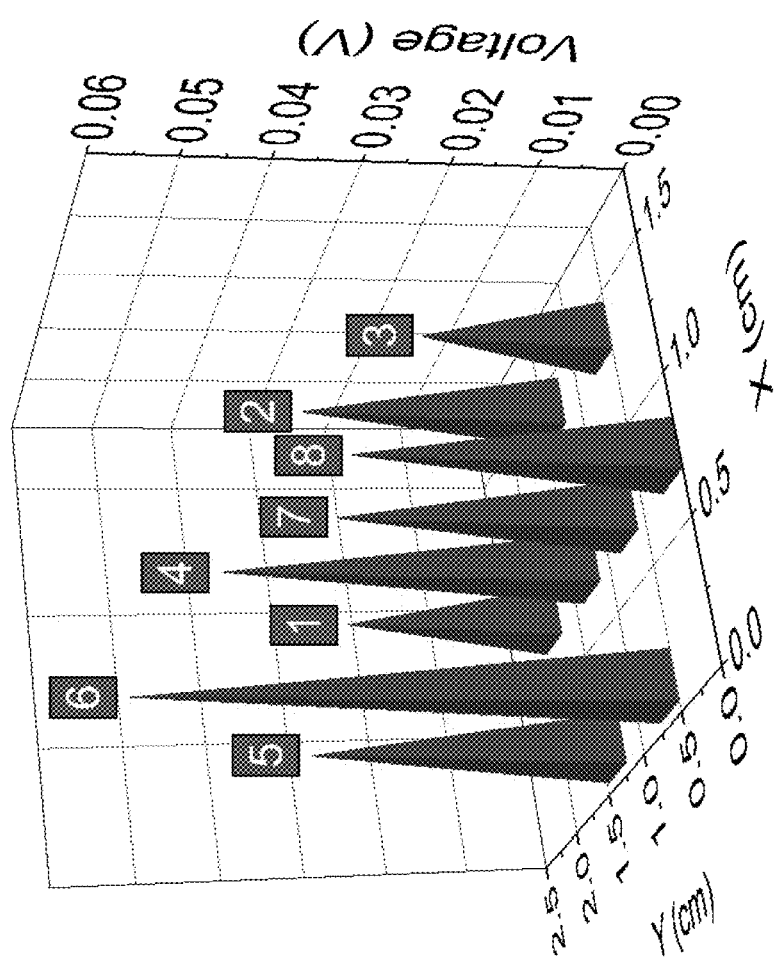
FIG. 26 contains a three-dimensional plot representing exact locations of each electrode along with the corresponding generated output voltage.

To demonstrate the pressure mapping capability of this anisotropic piezoelectric film, silver ink electrodes (0.25 cm×0.25 cm) were applied at eight different positions on a transparent PET substrate. The top electrode was ITO-coated PET, with a total thickness of 175 μm. The aligned PZT/GNPs/PDMS film was sandwiched between the top and bottom electrodes. This experimental set-up is shown in a schematic representation in FIG. 24. For calibration, a 20 g weight was dropped on each electrode pad one at a time from a certain distance to determine the response levels. A finger tap on the sample illustrated the effectiveness of the mapping process. Different voltage values were recorded for each electrode representing pressure variations caused by the nonuniform forces exerted by the fingertip due to its geometry (FIG. 25). Most of the pressure was delivered on electrode 6 since it had shown the highest signal, while the electrodes next to it (e.g., 7 and 8) exhibited relatively low signals. The electrodes far from electrode 6, such as electrodes 1 and 3, had the lowest pulse values (FIG. 26).

The promising high-tech future of the "Internet of Things" (IoT) and flexible electronics cannot be fully achieved without the availability of self-powered electronics and sensors. For this purpose, a great deal of research has been focused on the development of nano and macro-sized energy harvesters and sensors. To date suggested methods for production of highly efficient nanogenerators and sensors have been limited in terms of flexibility, transparency, sensitivity, and performance of the devices. As reported herein, high-performance PZT/GNP/PDMS devices were produced that were flexible and transparent, and shown to be well suited for use in piezoelectric nanogenerators and pressure sensors. With the electric field alignment method described above, the quantity of particles required to develop a piezoelectric effect was greatly reduced. As a result, transparency can be maintained for certain applications, for example, touchscreen interfaces, display panels, and electronic skin for soft robotics. The electric field-induced alignment of PZT particles along with conductive graphitic nanoparticles (graphene nanoplatelets) were shown to facilitate charge transport. As revealed by the SEM images, this preferential alignment in thickness direction gave rise to a unique structure where the pattern of the PZT chains around the GNPs are similar to those electric field lines around an electrically conducting particle when placed in a uniform external electric field.

Figure 27:
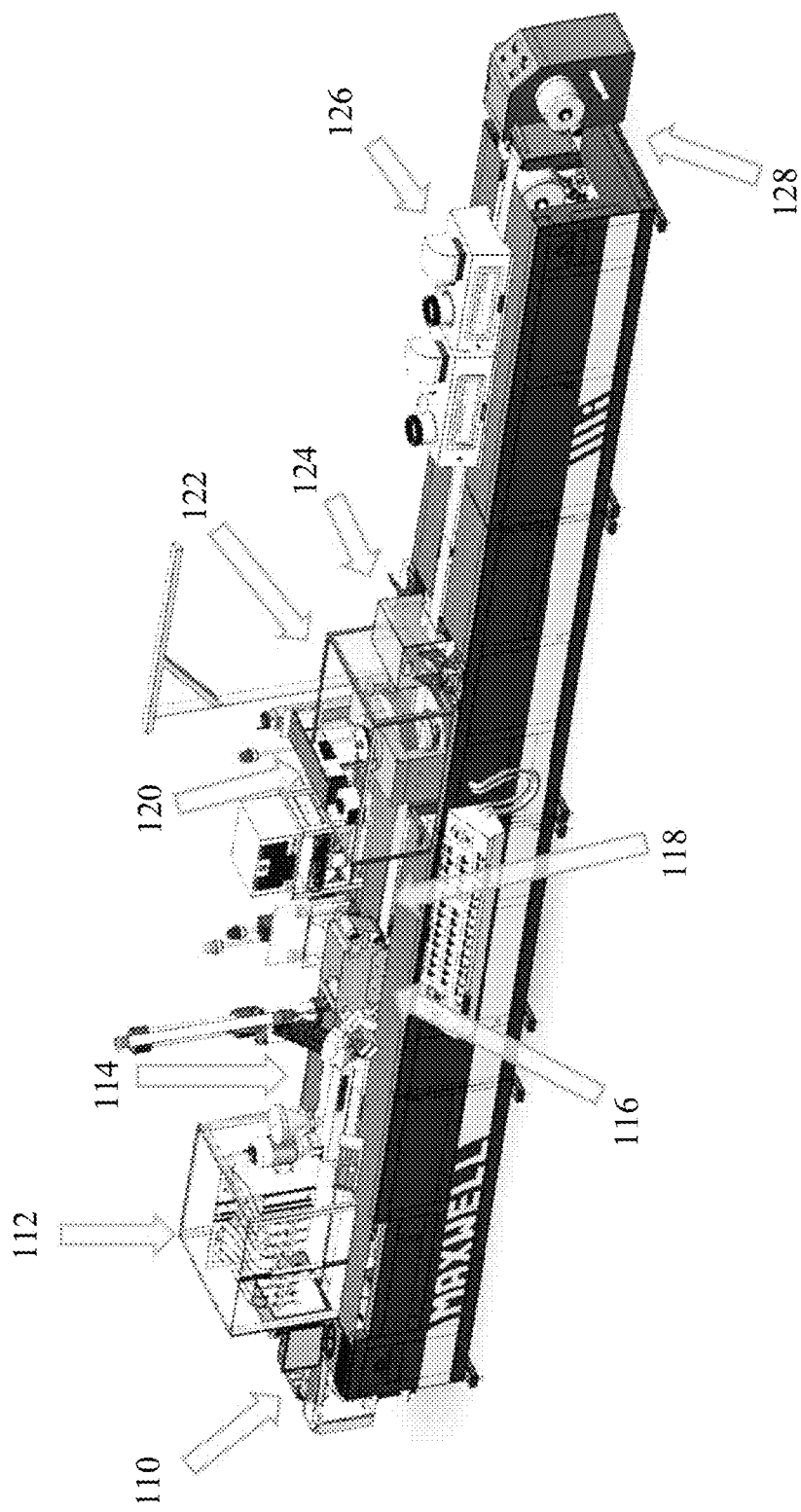
FIG. 27 contains a schematic representation of a nonlimiting example of a roll-to-roll continuous multi-functional film manufacturing line capable of producing PZT/GNPs/PDMS-based piezoelectric nanogenerators.

PZT/GNPs/PDMS-based piezoelectric nanogenerators and other piezoelectric polymer composite films configured as described above can be fully compatible with a continuous large-scale roll-to-roll (R2R) production line that is capable of increasing the size and number of devices that can be produced in a given time period while reducing material costs as compared to traditional batch methods. A nonlimiting example of a particular roll-to-roll continuous machine capable of producing piezoelectric polymer composite films is disclosed in International Publication WO2018/081357, whose contents are incorporated herein by reference. FIG. 27 schematically represents a nonlimiting example of a roll-to-roll multi-functional film manufacturing line disclosed in International Publication WO2018/081357, and depicts the manufacturing line as comprising various processing zones including but not limited to: an unwinding and solution casting zone 110, an electrospinning zone 112, a melt casting zone 114, an electric field (E-field) alignment zone 116, heating plates 118, a laser heating zone 120, a magnetic field alignment zone 122, an ultraviolet (UV) curing zone 124, a heating oven zone 126, and a rewind station zone 128.

During production of films with the machine of FIG. 27, a solution was initially cast via a doctor blade on a flexible and transparent substrate (e.g., PET) in the unwinding and solution casting zone where a high precision granite plate was used to level a casting blade. By using the information obtained from FIGS. 6A through 6F and FIG. 11, the line speed was precisely calculated and adjusted (e.g., 20 mm/min) to allow sufficient time for PZT and graphene particles to align under the electric field zone. The electric field zone included two electrodes; a conductive top electrode (e.g., copper or a transparent ITO-coated PET) and a grounded bottom electrode. The top electrode was connected to a high voltage (HV) amplifier combined with a wavefunction generator and an oscilloscope to generate and monitor the sinusoidal AC waveform and the amplitude of the electric field. Preferably, a 1 mm air gap was provided between the two electrodes by adjusting the digital height controller located on the HV amplifier.

Individual heating plates were utilized to control the curing process during the electric field alignment, three under the substrate and three on the top copper electrode. Four of the heating plates (two under the substrate and two on the top copper electrode) were maintained at room temperature to avoid any pre-curing of the sample and promote the effectiveness of electric field on formation of nanocolumns, whereas the temperatures of the remaining two heating plates (one under the substrate and one on the top copper electrode) were set to 85° C. to cure and then lock in the aligned column structures before they exit the electric field section. The electric field strength between the two electrodes was set to 1000 V/mm. SEM images (FIG. 16) were taken to verify the alignment.

Disclosed above are approaches to producing high performance, flexible and transparent PZT/Graphene nanoplatelets (GNPs)/PDMS (polydimethylsiloxane) based piezoelectric nanogenerators and a highly sensitive pressure sensor where PZT particles and GNPs were aligned under an AC electric field in the thickness direction. With the electric field alignment method described, the amount of particles required to develop a piezoelectric polymer composite was greatly reduced relative to conventional methods. As a result, transparency was maintained for desired applications such as touch screen interfaces. Moreover, this approach provides for alignment of PZT particles along with conductive graphitic nanoparticles (i.e. graphene nanoplatelets) to facilitate the charge transport in the system. As revealed by SEM images, this preferential alignment in the thickness direction gives rise to patterns of the PZT chains around the GNPs that are similar to the electric field lines around an electrically conducting particle placed in a uniform external electric field.

While the invention has been described in terms of specific or particular embodiments and investigations, it should be apparent that alternatives could be adopted by one skilled in the art. For example, piezoelectric composite devices could differ in appearance and construction from the embodiments described herein, various amounts of PZT and electrically conductive nanoparticles could be combined in a variety of polymer matrix materials, process parameters such as temperatures and durations could be modified, and appropriate materials could be substituted for those noted. In addition, the invention encompasses additional or alternative embodiments in which one or more features or aspects of different disclosed embodiments may be omitted or combined. Accordingly, it should be understood that the invention is not necessarily limited to any embodiment described herein or illustrated in the drawings. It should also be understood that the phraseology and terminology employed above are for the purpose of describing the disclosed and illustrated embodiments and investigations, and do not necessarily serve as limitations to the scope of the invention. Therefore, the scope of the invention is to be limited only by the following claims.

The invention claimed is:

1. A process for producing a piezoelectric polymer composite film, the process comprising:
combining lead zirconate titanate (PZT) particles and electrically conductive nanoparticles in a liquid polymer precursor matrix;
aligning the PZT and nanoparticles in a thickness direction of the liquid polymer precursor matrix by subjecting the PZT and nanoparticles to a uniform electric field; and
solidifying the liquid polymer precursor matrix to form a piezoelectric polymer composite film comprising the PZT and nanoparticles in a polymer matrix formed by solidifying the liquid polymer precursor matrix;
wherein the PZT and nanoparticles are subjected to the uniform electric field for a duration sufficient to promote sensitivity and/or energy harvesting properties of the piezoelectric polymer composite film.

2. The process of claim 1, wherein the PZT particles are combined in the liquid polymer precursor matrix in an amount by volume greater than the nanoparticles.

3. The process of claim 1, wherein the PZT particles are combined in the liquid polymer precursor matrix in an amount of about 0.05 vol % to about 15 vol %.

4. The process of claim 1, wherein the nanoparticles are combined in the liquid polymer precursor matrix in an amount of about 0.02 vol %.

5. The process of claim 1, wherein the nanoparticles are graphene nanoplatelets (GNPs).

6. The process of claim 1, wherein the nanoparticles are graphite or single or multiwall carbon nanotubes.

7. The process of claim 1, wherein the polymer matrix is a thermocurable or photocurable thermoset or thermoplastic.

8. The process of claim 1, wherein the polymer matrix is thermocurable polydimethylsiloxane (PDMS).

9. The process of claim 1, wherein the uniform electric field is an AC field at a constant frequency and about 250 to about 1000 V/mm.

10. The process of claim 1, wherein the piezoelectric polymer composite film has an optical transparency of about 90% or more.

11. The process of claim 1, wherein the piezoelectric polymer composite film is a component of a flexible nanogenerator.

12. The process of claim 1, wherein the piezoelectric polymer composite film is a component of a touchscreen interface, display panel, or electronic skin.

13. The process of claim 1, wherein the piezoelectric polymer composite film is a component of a pressure or force sensor.

14. The process of claim 1, wherein the process is performed by a roll-to-roll machine comprising:
   means for applying a liquid polymer on a substrate to form the liquid polymer precursor matrix;
   means for at least partially embedding the PZT and nanoparticles into the liquid polymer precursor matrix;
   means for melt casting a layer of a molten polymer on the liquid polymer precursor matrix to produce a thin polymer film;
   means for organizing the PZT and nanoparticles in a thickness direction of the thin polymer film comprising applying an electric field to the thin polymer film;
   means for aligning the PZT and nanoparticles in the thin polymer film by simultaneously subjecting the thin polymer film to heat and a field that aligns the PZT and nanoparticles; and
   means for solidifying the thin polymer film to freeze the PZT and nanoparticles along nanocolumns in a thickness direction of a solidified polymer film resulting therefrom.

15. A piezoelectric polymer composite film comprising a polymer matrix with lead zirconate titanate (PZT) particles and electrically conductive nanoparticles aligned along nanocolumns in a thickness direction of the polymer matrix.

16. The piezoelectric polymer composite film of claim 15, wherein the nanoparticles are graphene nanoplatelets (GNPs).

17. The piezoelectric polymer composite film of claim 15, wherein the nanoparticles are graphite or single or multiwall carbon nanotubes.

18. The piezoelectric polymer composite film of claim 15, wherein the polymer matrix is a thermocurable or photocurable thermoset or thermoplastic.

19. The piezoelectric polymer composite film of claim 15, wherein the polymer matrix is a soft polymer material chosen from the group consisting of thermocurable polyurethanes, silicone rubbers, and polydimethylsiloxane (PDMS).

20. The piezoelectric polymer composite film of claim 15, wherein the piezoelectric polymer composite film has an optical transparency of about 90% or more.

* * * * *